(12) United States Patent
Khlat

(10) Patent No.: US 12,212,285 B2
(45) Date of Patent: Jan. 28, 2025

(54) POWER MANAGEMENT APPARATUS OPERABLE WITH MULTIPLE CONFIGURATIONS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 1 day.

(21) Appl. No.: 18/039,805

(22) PCT Filed: Oct. 8, 2021

(86) PCT No.: PCT/US2021/054141
§ 371 (c)(1),
(2) Date: Jun. 1, 2023

(87) PCT Pub. No.: WO2022/139936
PCT Pub. Date: Jun. 30, 2022

(65) Prior Publication Data
US 2024/0030873 A1    Jan. 25, 2024

Related U.S. Application Data

(60) Provisional application No. 63/128,882, filed on Dec. 22, 2020.

(51) Int. Cl.
*H03F 1/02* (2006.01)
*H02M 1/00* (2006.01)
(Continued)

(52) U.S. Cl.
CPC ........ *H03F 1/0227* (2013.01); *H02M 1/0045* (2021.05); *H02M 3/07* (2013.01); *H03F 3/211* (2013.01); *H03F 2200/451* (2013.01)

(58) Field of Classification Search
None
See application file for complete search history.

(56) References Cited

U.S. PATENT DOCUMENTS

| 4,646,035 A | 2/1987 | Chapelle |
| 5,266,936 A | 11/1993 | Saitoh |

(Continued)

FOREIGN PATENT DOCUMENTS

| CN | 103916093 A | 7/2014 |
| CN | 104185953 A | 12/2014 |

(Continued)

OTHER PUBLICATIONS

Quayle Action for U.S. Appl. No. 16/589,940, mailed Dec. 4, 2020, 8 pages.

(Continued)

*Primary Examiner* — Thomas J. Hiltunen
(74) *Attorney, Agent, or Firm* — Withrow & Terranova, P.L.L.C.

(57) ABSTRACT

A power management apparatus operable with multiple configurations is disclosed. In embodiments disclosed herein, the power management apparatus can be configured to concurrently generate multiple modulated voltages based on a configuration including a single power management integrated circuit (PMIC) or a configuration including a PMIC and a distributed PMIC. Regardless of the configuration, the power management apparatus employs a single switcher circuit, wherein multiple reference voltage circuits are configured to share a multi-level charge pump (MCP). As a result, it is possible to reduce footprint of the power management apparatus while improving isolation between the multiple modulated voltages.

15 Claims, 2 Drawing Sheets

Figure 1:
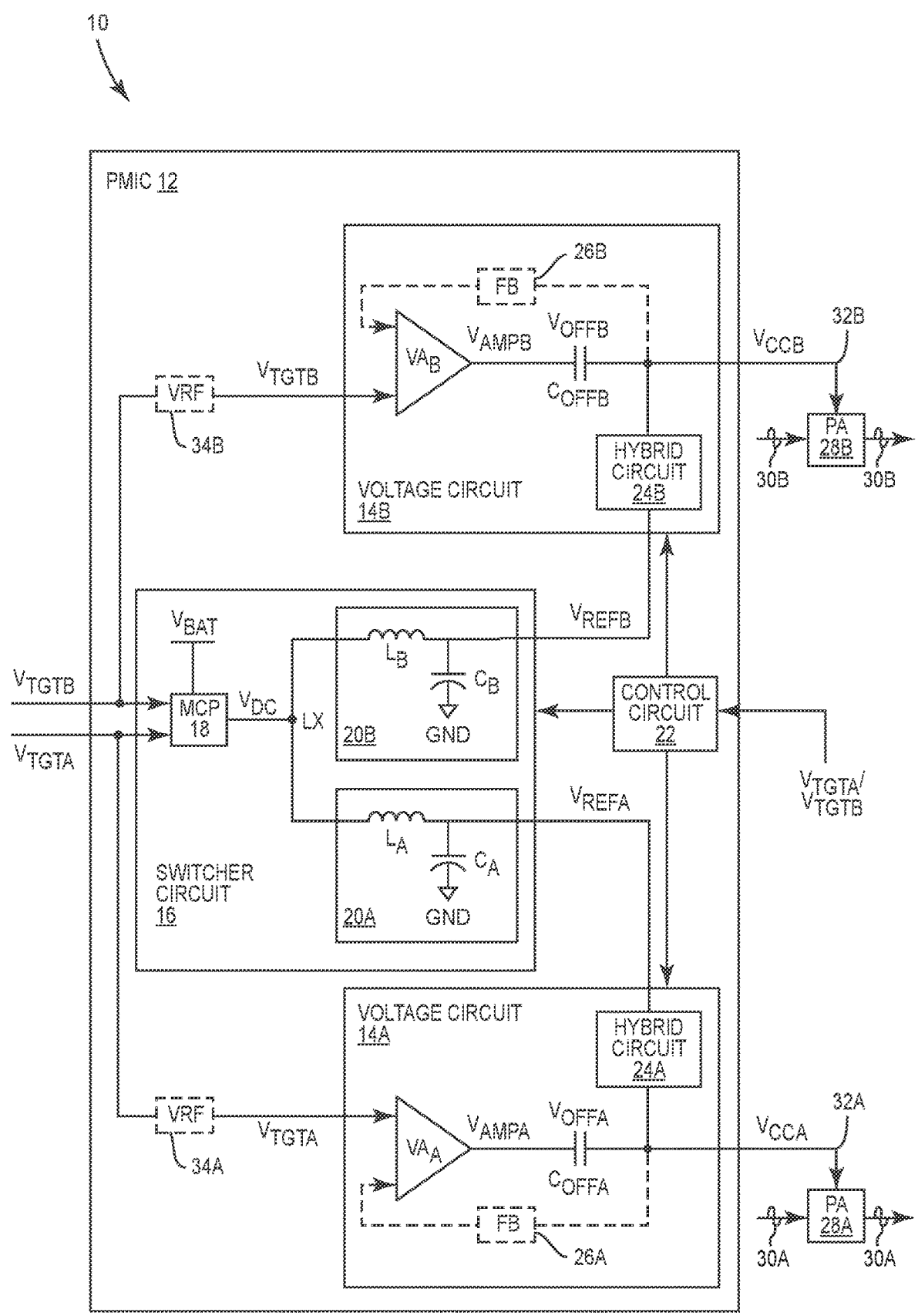

(51) Int. Cl.
*H02M 3/07* (2006.01)
*H03F 3/21* (2006.01)

(56) References Cited

U.S. PATENT DOCUMENTS

| | | |
|---|---|---|
| 5,510,753 A | 4/1996 | French |
| 5,838,732 A | 11/1998 | Carney |
| 6,107,862 A | 8/2000 | Mukainakano et al. |
| 6,141,377 A | 10/2000 | Sharper et al. |
| 6,141,541 A | 10/2000 | Midya et al. |
| 6,411,531 B1 | 6/2002 | Nork et al. |
| 6,985,033 B1 | 1/2006 | Shirali et al. |
| 7,043,213 B2 | 5/2006 | Robinson et al. |
| 7,193,467 B2 | 3/2007 | Garlepp et al. |
| 7,471,155 B1 | 12/2008 | Levesque |
| 7,570,931 B2 | 8/2009 | McCallister et al. |
| 7,994,862 B1 | 8/2011 | Pukhovski |
| 8,461,928 B2 | 6/2013 | Yahav et al. |
| 8,493,141 B2 | 7/2013 | Khlat et al. |
| 8,519,788 B2 | 8/2013 | Khlat |
| 8,588,713 B2 | 11/2013 | Khlat |
| 8,718,188 B2 | 5/2014 | Balteanu et al. |
| 8,723,492 B2 | 5/2014 | Korzeniowski |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,942,651 B2 | 1/2015 | Jones |
| 8,947,161 B2 | 2/2015 | Khlat et al. |
| 8,989,682 B2 | 3/2015 | Ripley et al. |
| 9,018,921 B2 | 4/2015 | Gurlahosur |
| 9,020,451 B2 | 4/2015 | Khlat |
| 9,020,453 B2 * | 4/2015 | Briffa ................ H04B 1/0483 455/127.1 |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,172,303 B2 | 10/2015 | Vasadi et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,362,868 B2 | 6/2016 | Al-Qaq et al. |
| 9,377,797 B2 | 6/2016 | Kay et al. |
| 9,379,667 B2 | 6/2016 | Khlat et al. |
| 9,445,371 B2 | 9/2016 | Khesbak et al. |
| 9,491,314 B2 * | 11/2016 | Wimpenny ............. H03F 3/217 |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,705,451 B2 | 7/2017 | Takenaka et al. |
| 9,748,845 B1 | 8/2017 | Kotikalapoodi |
| 9,768,731 B2 * | 9/2017 | Perreault ............. H04B 1/0475 |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,900,204 B2 | 2/2018 | Levesque et al. |
| 9,912,297 B2 * | 3/2018 | Khlat ................ H03F 3/19 |
| 9,923,520 B1 | 3/2018 | Abdelfattah et al. |
| 10,003,416 B1 | 6/2018 | Lloyd |
| 10,084,376 B2 | 9/2018 | Lofthouse |
| 10,090,808 B1 | 10/2018 | Henzler et al. |
| 10,090,809 B1 | 10/2018 | Khlat |
| 10,097,145 B1 | 10/2018 | Khlat et al. |
| 10,103,693 B2 | 10/2018 | Zhu et al. |
| 10,110,169 B2 | 10/2018 | Khesbak et al. |
| 10,116,470 B2 | 10/2018 | Gu et al. |
| 10,158,329 B1 | 12/2018 | Khla |
| 10,158,330 B1 | 12/2018 | Khlat |
| 10,170,989 B2 | 1/2019 | Balteanu et al. |
| 10,284,412 B2 | 5/2019 | Khlat et al. |
| 10,291,126 B1 | 5/2019 | Wei et al. |
| 10,291,181 B2 | 5/2019 | Kim et al. |
| 10,326,408 B2 | 6/2019 | Khlat et al. |
| 10,361,744 B1 | 7/2019 | Khlat |
| 10,381,983 B2 * | 8/2019 | Balteanu ............. H04B 1/0483 |
| 10,382,071 B2 | 8/2019 | Rozek et al. |
| 10,439,557 B2 | 10/2019 | Khlat et al. |
| 10,476,437 B2 | 11/2019 | Nag et al. |
| 10,622,900 B1 | 4/2020 | Wei et al. |
| 10,680,556 B2 | 6/2020 | Khlat |
| 10,756,675 B2 | 8/2020 | Leipold et al. |
| 10,862,431 B1 | 12/2020 | Khlat |
| 10,873,260 B2 | 12/2020 | Yan et al. |
| 10,879,804 B2 | 12/2020 | Kim et al. |
| 11,050,433 B1 | 6/2021 | Melanson et al. |
| 11,121,684 B2 | 9/2021 | Henzler et al. |
| 11,128,261 B2 | 9/2021 | Ranta et al. |
| 11,139,780 B2 * | 10/2021 | Khlat ................ H03F 3/245 |
| 11,558,016 B2 * | 1/2023 | Khlat ................ H03F 3/245 |
| 11,637,531 B1 | 4/2023 | Perreault et al. |
| 11,848,564 B2 | 12/2023 | Jung et al. |
| 2002/0021110 A1 | 2/2002 | Nakagawa et al. |
| 2002/0157069 A1 | 10/2002 | Ogawa et al. |
| 2002/0167827 A1 | 11/2002 | Umeda et al. |
| 2003/0107428 A1 | 6/2003 | Khouri et al. |
| 2004/0201281 A1 | 10/2004 | Ma et al. |
| 2004/0266366 A1 | 12/2004 | Robinson et al. |
| 2005/0088160 A1 | 4/2005 | Tanaka et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0028271 A1 | 2/2006 | Wilson |
| 2006/0240786 A1 | 10/2006 | Liu |
| 2007/0036212 A1 | 2/2007 | Leung et al. |
| 2007/0052474 A1 | 3/2007 | Saito |
| 2007/0053217 A1 | 3/2007 | Darroman |
| 2007/0258602 A1 | 11/2007 | Vepsalainen et al. |
| 2007/0290748 A1 | 12/2007 | Woo et al. |
| 2008/0116960 A1 | 5/2008 | Nakamura |
| 2008/0231115 A1 | 9/2008 | Cho et al. |
| 2008/0231358 A1 | 9/2008 | Maemura |
| 2008/0239772 A1 | 10/2008 | Oraw et al. |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0019052 A1 | 1/2010 | Yip |
| 2010/0039321 A1 | 2/2010 | Abraham |
| 2010/0283534 A1 | 11/2010 | Pierdomenico |
| 2010/0308919 A1 | 12/2010 | Adamski et al. |
| 2011/0068757 A1 | 3/2011 | Xu et al. |
| 2011/0074373 A1 | 3/2011 | Lin |
| 2011/0136452 A1 | 6/2011 | Pratt et al. |
| 2011/0148705 A1 | 6/2011 | Kenington |
| 2011/0175681 A1 | 7/2011 | Inamori et al. |
| 2011/0199156 A1 | 8/2011 | Hayakawa |
| 2011/0279179 A1 | 11/2011 | Vice |
| 2012/0062031 A1 | 3/2012 | Buthker |
| 2012/0194274 A1 | 8/2012 | Fowers et al. |
| 2012/0200435 A1 | 8/2012 | Ngo et al. |
| 2012/0274134 A1 | 11/2012 | Gasparini et al. |
| 2012/0281597 A1 | 11/2012 | Khlat et al. |

(56) References Cited

U.S. PATENT DOCUMENTS

| | | |
|---|---|---|
| 2012/0286576 A1 | 11/2012 | Jing et al. |
| 2012/0299645 A1 | 11/2012 | Southcombe et al. |
| 2012/0299647 A1 | 11/2012 | Honjo et al. |
| 2012/0326691 A1 | 12/2012 | Kuan et al. |
| 2013/0021827 A1 | 1/2013 | Ye |
| 2013/0063118 A1 | 3/2013 | Nguyen et al. |
| 2013/0072139 A1 | 3/2013 | Kang et al. |
| 2013/0100991 A1 | 4/2013 | Woo |
| 2013/0127548 A1 | 5/2013 | Popplewell et al. |
| 2013/0130724 A1 | 5/2013 | Kumar Reddy et al. |
| 2013/0141064 A1 | 6/2013 | Kay et al. |
| 2013/0162233 A1 | 6/2013 | Marty |
| 2013/0176961 A1 | 7/2013 | Kanamarlapudi et al. |
| 2013/0187711 A1 | 7/2013 | Goedken et al. |
| 2013/0200865 A1 | 8/2013 | Wimpenny |
| 2013/0207731 A1 | 8/2013 | Balteanu |
| 2013/0234513 A1 | 9/2013 | Bayer |
| 2013/0234692 A1 | 9/2013 | Liang et al. |
| 2013/0271221 A1 | 10/2013 | Levesque et al. |
| 2013/0288612 A1 | 10/2013 | Afsahi et al. |
| 2014/0009226 A1 | 1/2014 | Severson |
| 2014/0028370 A1 | 1/2014 | Wimpenny |
| 2014/0028390 A1 | 1/2014 | Davis |
| 2014/0055197 A1 | 2/2014 | Khlat et al. |
| 2014/0057684 A1 | 2/2014 | Khlat |
| 2014/0097820 A1 | 4/2014 | Miyamae |
| 2014/0103995 A1 | 4/2014 | Langer |
| 2014/0145692 A1 | 5/2014 | Miyamae |
| 2014/0155002 A1 | 6/2014 | Dakshinamurthy et al. |
| 2014/0169427 A1 | 6/2014 | Asensio et al. |
| 2014/0184335 A1 | 7/2014 | Nobbe et al. |
| 2014/0199949 A1 | 7/2014 | Nagode et al. |
| 2014/0203869 A1 | 7/2014 | Khlat et al. |
| 2014/0210550 A1 | 7/2014 | Mathe et al. |
| 2014/0213196 A1 | 7/2014 | Langer et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2014/0361837 A1 | 12/2014 | Strange et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0139358 A1 | 5/2015 | Asuri et al. |
| 2015/0145600 A1 | 5/2015 | Hur et al. |
| 2015/0155836 A1 | 6/2015 | Midya et al. |
| 2015/0188432 A1 | 7/2015 | Vannorsdel et al. |
| 2015/0234402 A1 | 8/2015 | Kay et al. |
| 2015/0236652 A1 | 8/2015 | Yang et al. |
| 2015/0236654 A1 | 8/2015 | Jiang et al. |
| 2015/0236729 A1 | 8/2015 | Peng et al. |
| 2015/0236877 A1 | 8/2015 | Peng et al. |
| 2015/0280652 A1 | 10/2015 | Cohen |
| 2015/0302845 A1 | 10/2015 | Nakano et al. |
| 2015/0311791 A1 | 10/2015 | Tseng et al. |
| 2015/0326114 A1 | 11/2015 | Rolland |
| 2015/0333781 A1 | 11/2015 | Alon et al. |
| 2016/0050629 A1 | 2/2016 | Khesbak et al. |
| 2016/0065137 A1 | 3/2016 | Khlat |
| 2016/0065139 A1 | 3/2016 | Lee et al. |
| 2016/0099686 A1* | 4/2016 | Perreault ............... H03F 1/0211 330/296 |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0164550 A1 | 6/2016 | Pilgram |
| 2016/0164551 A1 | 6/2016 | Khlat et al. |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0249300 A1 | 8/2016 | Tsai et al. |
| 2016/0294587 A1 | 10/2016 | Jiang et al. |
| 2017/0005619 A1 | 1/2017 | Khlat |
| 2017/0005676 A1 | 1/2017 | Yan et al. |
| 2017/0006543 A1 | 1/2017 | Khlat |
| 2017/0012675 A1 | 1/2017 | Frederick |
| 2017/0018718 A1 | 1/2017 | Jang et al. |
| 2017/0141736 A1 | 5/2017 | Pratt et al. |
| 2017/0149240 A1 | 5/2017 | Wu et al. |
| 2017/0187187 A1 | 6/2017 | Amin et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0123516 A1 | 5/2018 | Kim et al. |
| 2018/0152144 A1 | 5/2018 | Choo et al. |
| 2018/0254530 A1 | 9/2018 | Wigney |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2018/0375483 A1 | 12/2018 | Balteanu et al. |
| 2019/0028060 A1 | 1/2019 | Jo et al. |
| 2019/0044480 A1 | 2/2019 | Khlat |
| 2019/0068051 A1 | 2/2019 | Yang et al. |
| 2019/0068234 A1 | 2/2019 | Khlat et al. |
| 2019/0097277 A1 | 3/2019 | Fukae |
| 2019/0103766 A1 | 4/2019 | Von Novak, III et al. |
| 2019/0109566 A1 | 4/2019 | Folkmann et al. |
| 2019/0109613 A1 | 4/2019 | Khiat et al. |
| 2019/0181804 A1 | 6/2019 | Khlat |
| 2019/0199215 A1 | 6/2019 | Zhao et al. |
| 2019/0222178 A1 | 7/2019 | Khlat et al. |
| 2019/0229623 A1 | 7/2019 | Tsuda et al. |
| 2019/0238095 A1 | 8/2019 | Khlat |
| 2019/0253023 A1 | 8/2019 | Yang et al. |
| 2019/0267956 A1 | 8/2019 | Granger-Jones et al. |
| 2019/0288645 A1 | 9/2019 | Nag et al. |
| 2019/0322175 A1 | 10/2019 | Khlat et al. |
| 2019/0319584 A1 | 10/2019 | Khlat et al. |
| 2019/0386565 A1 | 12/2019 | Rosolowski et al. |
| 2020/0007090 A1 | 1/2020 | Khlat et al. |
| 2020/0036337 A1 | 1/2020 | Khlat |
| 2020/0091878 A1 | 3/2020 | Maxim et al. |
| 2020/0106392 A1 | 4/2020 | Khlat et al. |
| 2020/0127608 A1 | 4/2020 | Khlat |
| 2020/0127625 A1 | 4/2020 | Khlat |
| 2020/0127730 A1 | 4/2020 | Khlat |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2020/0304020 A1 | 9/2020 | Lu et al. |
| 2020/0313622 A1 | 10/2020 | Eichler et al. |
| 2020/0321848 A1 | 10/2020 | Khlat |
| 2020/0321917 A1 | 10/2020 | Nomiyama et al. |
| 2020/0328677 A1 | 10/2020 | Amin et al. |
| 2020/0328720 A1 | 10/2020 | Khlat |
| 2020/0336105 A1 | 10/2020 | Khlat |
| 2020/0336111 A1 | 10/2020 | Khlat |
| 2020/0350865 A1 | 11/2020 | Khlat |
| 2020/0350866 A1 | 11/2020 | Pehlke |
| 2020/0350878 A1 | 11/2020 | Drogi et al. |
| 2020/0382061 A1 | 12/2020 | Khlat |
| 2020/0382066 A1 | 12/2020 | Khlat |
| 2021/0036596 A1 | 2/2021 | Jeon et al. |
| 2021/0036604 A1 | 2/2021 | Khlat et al. |

(56) References Cited

U.S. PATENT DOCUMENTS

| | | | |
|---|---|---|---|
| 2021/0075372 A1 | 3/2021 | Henzler et al. |
| 2021/0099137 A1 | 4/2021 | Drogi et al. |
| 2021/0159590 A1 | 5/2021 | Na et al. |
| 2021/0175896 A1 | 6/2021 | Melanson et al. |
| 2021/0184708 A1 | 6/2021 | Khlat |
| 2021/0194437 A1 | 6/2021 | Stockert |
| 2021/0194515 A1 | 6/2021 | Go et al. |
| 2021/0194517 A1 | 6/2021 | Mirea et al. |
| 2021/0194522 A1 | 6/2021 | Stockert et al. |
| 2021/0211108 A1 | 7/2021 | Khlat |
| 2021/0226585 A1 | 7/2021 | Khlat |
| 2021/0234513 A1 | 7/2021 | Khlat |
| 2021/0257971 A1 | 8/2021 | Kim et al. |
| 2021/0265953 A1 | 8/2021 | Khlat |
| 2021/0281228 A1 | 9/2021 | Khlat |
| 2021/0288615 A1 | 9/2021 | Khlat |
| 2021/0305944 A1 | 9/2021 | Scott et al. |
| 2021/0356299 A1 | 11/2021 | Park |
| 2022/0021348 A1 | 1/2022 | Philpott et al. |
| 2022/0094256 A1 | 3/2022 | Radhakrishnan et al. |
| 2022/0123698 A1 | 4/2022 | Goto et al. |
| 2022/0123744 A1 | 4/2022 | Khlat |
| 2022/0181974 A1 | 6/2022 | Liu et al. |
| 2022/0224294 A1 | 7/2022 | Khlat et al. |
| 2022/0263474 A1 | 8/2022 | Khlat |
| 2022/0278651 A1 | 9/2022 | Khlat |
| 2022/0286094 A1 | 9/2022 | Granger-Jones et al. |
| 2022/0385239 A1 | 12/2022 | Khlat |
| 2022/0399861 A1 | 12/2022 | Khlat |
| 2023/0113677 A1 | 4/2023 | Boley et al. |

FOREIGN PATENT DOCUMENTS

| | | | |
|---|---|---|---|
| CN | 104620509 A | 5/2015 |
| CN | 104954301 A | 9/2015 |
| CN | 105322894 A | 2/2016 |
| CN | 105680807 A | 6/2016 |
| CN | 105703716 A | 6/2016 |
| CN | 105721366 A | 6/2016 |
| CN | 106208974 A | 12/2016 |
| CN | 106209270 A | 12/2016 |
| CN | 106877824 A | 6/2017 |
| CN | 107093987 A | 8/2017 |
| CN | 107980205 A | 5/2018 |
| CN | 108141184 A | 6/2018 |
| CN | 109150212 A | 1/2019 |
| DE | 102019220150 A1 | 6/2020 |
| EP | 3174199 A2 | 5/2012 |
| EP | 2909928 A1 | 8/2015 |
| JP | H03104422 A | 5/1991 |
| WO | 2018182778 A1 | 10/2018 |
| WO | 2020206246 A1 | 10/2020 |
| WO | 2021016350 A1 | 1/2021 |
| WO | 2021046453 A1 | 3/2021 |
| WO | 2022103493 A1 | 5/2022 |

OTHER PUBLICATIONS

Notice of Allowance for U.S. Appl. No. 16/122,611, mailed Jan. 13, 2021, 8 pages.
Notice of Allowance for U.S. Appl. No. 16/284,023, mailed Jan. 19, 2021, 7 pages.
Notice of Allowance for U.S. Appl. No. 16/416,812, mailed Feb. 16, 2021, 8 pages.
Non-Final Office Action for U.S. Appl. No. 16/689,236 mailed Mar. 2, 2021, 15 pages.
Notice of Allowance for U.S. Appl. No. 16/435,940, mailed Dec. 21, 2020, 7 pages.
Notice of Allowance for U.S. Appl. No. 16/774,060, mailed Feb. 3, 2021, 7 pages.
Notice of Allowance for U.S. Appl. No. 16/590,790, mailed Jan. 27, 2021, 7 pages.
Notice of Allowance for U.S. Appl. No. 16/661,061, mailed Feb. 10, 2021, 7 pages.
Notice of Allowance for U.S. Appl. No. 16/122,611, mailed Apr. 1, 2021, 8 pages.
Non-Final Office Action for U.S. Appl. No. 16/582,471, mailed Mar. 24, 2021, 11 pages.
Wan, F. et al., "Negative Group Delay Theory of a Four-Port RC-Network Feedback Operational Amplifier," IEEE Access, vol. 7, Jun. 13, 2019, IEEE, 13 pages.
Notice of Allowance for U.S. Appl. No. 16/689,236 mailed Jun. 9, 2021, 7 pages.
Non-Final Office Action for U.S. Appl. No. 16/775,554, mailed Jun. 14, 2021, 5 pages.
Notice of Allowance for U.S. Appl. No. 16/582,471, mailed Jun. 22, 2021, 9 pages.
Non-Final Office Action for U.S. Appl. No. 16/597,952, mailed May 26, 2021, 7 pages.
Notice of Allowance for U.S. Appl. No. 16/834,049, mailed Jun. 24, 2021, 8 pages.
Chen, S. et al., "A 4.5 µW 2.4 GHz Wake-Up Receiver Based on Complementary Current-Reuse RF Detector," 2015 IEEE International Symposium on Circuits and Systems (ISCAS), May 24-27, 2015, IEEE, pp. 1214-1217.
Ying, K. et al., "A Wideband Envelope Detector with Low Ripple and High Detection Speed," 2018 IEEE International Symposium on Circuits and Systems (ISCAS), May 27-30, 2018, IEEE, 5 pages.
Notice of Allowance for U.S. Appl. No. 17/011,313, mailed Nov. 4, 2021, 8 pages.
Notice of Allowance for U.S. Appl. No. 16/582,471, mailed Feb. 1, 2022, 9 pages.
Non-Final Office Action for U.S. Appl. No. 16/597,952, mailed Nov. 10, 2021, 9 pages.
Quayle Action for U.S. Appl. No. 16/855,154, mailed Oct. 25, 2021, 6 pages.
Non-Final Office Action for U.S. Appl. No. 16/807,575, mailed Jan. 31, 2022, 12 pages.
International Search Report and Written Opinion for International Patent Application No. PCT/US2021/050892, mailed Jan. 5, 2022, 20 pages.
International Search Report and Written Opinion for International Patent Application No. PCT/US2021/052151, mailed Jan. 4, 2022, 16 pages.
International Search Report and Written Opinion for International Patent Application No. PCT/US2021/054141 mailed Jan. 25, 2022, 15 pages.
Notice of Allowance for U.S. Appl. No. 17/115,982, mailed Nov. 12, 2021, 8 pages.
Non-Final Office Action for U.S. Appl. No. 17/126,561, mailed Oct. 14, 2021, 6 pages.
Non-Final Office Action for U.S. Appl. No. 17/032,553, mailed Mar. 21, 2022, 4 pages.
Non-Final Office Action for U.S. Appl. No. 17/073,764, mailed Dec. 24, 2021, 22 pages.
International Search Report and Written Opinion for International Patent Application No. PCT/US2021/052830, mailed Jan. 24, 2022, 13 pages.
Notice of Allowance for U.S. Appl. No. 15/964,762, mailed Mar. 18, 2019, 7 pages.
Non-Final Office Action for U.S. Appl. No. 16/263,316, mailed Dec. 23, 2019, 10 pages.
Final Office Action for U.S. Appl. No. 16/263,316, mailed May 13, 2020, 10 pages.
Non-Final Office Action for U.S. Appl. No. 16/263,316, mailed Jul. 17, 2020, 4 pages.
Non-Final Office Action for U.S. Appl. No. 16/263,316, mailed Nov. 24, 2020, 4 pages.
Notice of Allowance for U.S. Appl. No. 16/263,316, mailed Mar. 30, 2021, 7 pages.
First Office Action for Chinese Patent Application No. 202010083654.0, mailed May 12, 2023, 17 pages.
Notification to Grant for Chinese Patent Application No. 202010097807.7, mailed Jul. 11, 2023, 14 pages.

(56) References Cited

OTHER PUBLICATIONS

Final Office Action for U.S. Appl. No. 16/807,575, mailed May 4, 2022, 12 pages.
Advisory Action for U.S. Appl. No. 16/807,575, mailed Jul. 28, 2022, 3 pages.
Notice of Allowance for U.S. Appl. No. 16/807,575, mailed Aug. 19, 2022, 8 pages.
International Preliminary Report on Patentability for International Patent Application No. PCT/US2021/050892, mailed Oct. 24, 2022, 20 pages.
International Preliminary Report on Patentability for International Patent Application No. PCT/US2021/052151, mailed Oct. 13, 2022, 21 pages.
International Preliminary Report on Patentability for International Patent Application No. PCT/US2021/054141, mailed Sep. 29, 2022, 20 pages.
Notice of Allowance for U.S. Appl. No. 17/148,064, mailed Aug. 18, 2022, 8 pages.
Non-Final Office Action for U.S. Appl. No. 17/146,765, mailed Sep. 7, 2022, 10 pages.
Non-Final Office Action for U.S. Appl. No. 17/163,642, mailed Aug. 17, 2022, 9 pages.
Final Office Action for U.S. Appl. No. 17/163,642, mailed Nov. 25, 2022, 13 pages.
Non-Final Office Action for U.S. Appl. No. 14/836,634, mailed May 16, 2016, 9 pages.
Non-Final Office Action for U.S. Appl. No. 14/868,890, mailed Jul. 14, 2016, 13 pages.
Non-Final Office Action for U.S. Appl. No. 15/792,909, mailed May 18, 2018, 13 pages.
Notice of Allowance for U.S. Appl. No. 15/459,449, mailed Mar. 28, 2018, 7 pages.
Notice of Allowance for U.S. Appl. No. 15/723,460, mailed Jul. 24, 2018, 8 pages.
Notice of Allowance for U.S. Appl. No. 15/704,131, mailed Jul. 17, 2018, 7 pages.
Notice of Allowance for U.S. Appl. No. 15/728,202, mailed Aug. 2, 2018, 7 pages.
Non-Final Office Action for U.S. Appl. No. 15/888,300, mailed Aug. 28, 2018, 11 pages.
Notice of Allowance for U.S. Appl. No. 15/792,909, mailed Dec. 19, 2018, 11 pages.
Notice of Allowance for U.S. Appl. No. 15/993,705, mailed Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, mailed May 2, 2019, 14 pages.
Non-Final Office Action for U.S. Appl. No. 15/986,948, mailed Mar. 28, 2019, 8 pages.
Non-Final Office Action for U.S. Appl. No. 16/018,426, mailed Apr. 11, 2019, 11 pages.
Supplemental Notice of Allowability for U.S. Appl. No. 15/902,244, mailed Mar. 20, 2019, 6 pages.
Notice of Allowance for U.S. Appl. No. 15/902,244, mailed Feb. 8, 2019, 8 pages.
Advisory Action for U.S. Appl. No. 15/888,300, mailed Jun. 5, 2019, 3 pages.
Notice of Allowance for U.S. Appl. No. 15/984,566, mailed May 21, 2019, 6 pages.
Notice of Allowance for U.S. Appl. No. 16/150,556, mailed Jul. 29, 2019, 7 pages.
Non-Final Office Action for U.S. Appl. No. 15/888,300, mailed Jun. 27, 2019, 17 pages.
Final Office Action for U.S. Appl. No. 15/986,948, mailed Aug. 27, 2019, 9 pages.
Advisory Action for U.S. Appl. No. 15/986,948, mailed Nov. 8, 2019, 3 pages.
Notice of Allowance for U.S. Appl. No. 15/986,948, mailed Dec. 13, 2019, 7 pages.
Final Office Action for U.S. Appl. No. 16/018,426, mailed Sep. 4, 2019, 12 pages.
Advisory Action for U.S. Appl. No. 16/018,426, mailed Nov. 19, 2019, 3 pages.
Notice of Allowance for U.S. Appl. No. 16/180,887, mailed Jan. 13, 2020, 8 pages.
Notice of Allowance for U.S. Appl. No. 15/888,300, mailed Jan. 14, 2020, 11 pages.
Non-Final Office Action for U.S. Appl. No. 16/122,611, mailed Mar. 11, 2020, 16 pages.
Corrected Notice of Allowability for U.S. Appl. No. 15/888,300, mailed Feb. 25, 2020, 7 pages.
Notice of Allowance for U.S. Appl. No. 16/018,426, mailed Mar. 31, 2020, 7 pages.
Non-Final Office Action for U.S. Appl. No. 16/174,535, mailed Feb. 4, 2020, 7 pages.
Quayle Action for U.S. Appl. No. 16/354,234, mailed Mar. 6, 2020, 8 pages.
Notice of Allowance for U.S. Appl. No. 16/354,234, mailed Apr. 24, 2020, 9 pages.
Non-Final Office Action for U.S. Appl. No. 16/246,859, mailed Apr. 28, 2020, 9 pages.
Corrected Notice of Allowability for U.S. Appl. No. 15/888,300, mailed May 13, 2020, 7 pages.
Notice of Allowance for U.S. Appl. No. 16/155,127, mailed Jun. 1, 2020, 8 pages.
Final Office Action for U.S. Appl. No. 16/174,535, mailed Jul. 1, 2020, 7 pages.
Non-Final Office Action for U.S. Appl. No. 16/284,023, mailed Jun. 24, 2020, 7 pages.
Non-Final Office Action for U.S. Appl. No. 16/435,940, mailed Jul. 23, 2020, 6 pages.
Final Office Action for U.S. Appl. No. 15/888,300, mailed Feb. 15, 2019, 15 pages.
Final Office Action for U.S. Appl. No. 16/122,611, mailed Sep. 18, 2020, 17 pages.
Advisory Action for U.S. Appl. No. 16/174,535, mailed Sep. 24, 2020, 3 pages.
Notice of Allowance for U.S. Appl. No. 16/174,535, mailed Oct. 29, 2020, 7 pages.
Notice of Allowance for U.S. Appl. No. 16/246,859, mailed Sep. 18, 2020, 8 pages.
Final Office Action for U.S. Appl. No. 16/284,023, mailed Nov. 3, 2020, 7 pages.
Quayle Action for U.S. Appl. No. 16/421,905, mailed Aug. 25, 2020, 5 pages.
Non-Final Office Action for U.S. Appl. No. 16/416,812, mailed Oct. 16, 2020, 8 pages.
Non-Final Office Action for U.S. Appl. No. 16/514,051, mailed Nov. 13, 2020, 9 pages.
Non-Final Office Action for U.S. Appl. No. 16/774,060, mailed Aug. 17, 2020, 6 pages.
Notice of Allowance for U.S. Appl. No. 16/122,611, mailed Dec. 1, 2020, 9 pages.
Notice of Allowance for U.S. Appl. No. 17/073,764, mailed Aug. 23, 2023, 12 pages.
Non-Final Office Action for U.S. Appl. No. 17/363,568, mailed Nov. 9, 2023, 8 pages.
Decision to Grant for Chinese Patent Application No. 202010083654.0, mailed Sep. 11, 2023, 8 pages.
Intention to Grant for European Patent Application No. 21806074.7, mailed May 10, 2024, 27 pages.
Notice of Allowance for U.S. Appl. No. 17/363,568, mailed Apr. 17, 2024, 6 pages.
Notice of Allowance for U.S. Appl. No. 17/331,996, mailed Jun. 14, 2024, 9 pages.
Notice of Allowance for U.S. Appl. No. 17/351,560, mailed Apr. 19, 2024, 8 pages.
International Search Report and Written Opinion for International Patent Application No. PCT/US2023/085103, mailed Apr. 26, 2024, 17 pages.
U.S. Appl. No. 18/252,147, filed May 8, 2023.
U.S. Appl. No. 18/252,155, filed May 8, 2023.

(56) References Cited

OTHER PUBLICATIONS

U.S. Appl. No. 18/254,155, filed May 23, 2023.
Notice of Allowance for U.S. Appl. No. 17/163,642, mailed Mar. 1, 2023, 10 pages.
Final Office Action for U.S. Appl. No. 17/032,553, mailed Jul. 29, 2022, 6 pages.
Notice of Allowance for U.S. Appl. No. 17/032,553, mailed Oct. 11, 2022, 7 pages.
Final Office Action for U.S. Appl. No. 17/073,764, mailed Jun. 1, 2022, 22 pages.
Advisory Action for U.S. Appl. No. 17/073,764, mailed Aug. 23, 2022, 3 pages.
Non-Final Office Action for U.S. Appl. No. 17/073,764, mailed Sep. 30, 2022, 13 pages.
Final Office Action for U.S. Appl. No. 17/073,764, mailed Mar. 3, 2023, 14 pages.
Advisory Action for U.S. Appl. No. 17/073,764, mailed May 26, 2023, 3 pages.
Extended European Search Report for European Patent Application No. 22153526.3, mailed Jul. 13, 2022, 9 pages.
Written Opinion for International Patent Application No. PCT/US2021/052830, mailed Nov. 3, 2022, 7 pages.
International Preliminary Report on Patentability for International Patent Application No. PCT/US2021/052830, mailed Feb. 20, 2023, 21 pages.
Notification to Grant for Chinese Patent Application No. 202010083654.0, mailed Nov. 9, 2023, 8 pages.
Notice of Allowance for U.S. Appl. No. 17/363,568, mailed Jan. 3, 2024, 7 pages.
Non-Final Office Action for U.S. Appl. No. 17/343,912, mailed Dec. 14, 2023, 6 pages.
Quayle Action for U.S. Appl. No. 17/351,560, mailed Nov. 24, 2023, 7 pages.
Notice of Allowance for U.S. Appl. No. 17/351,560, mailed Jan. 4, 2024, 7 pages.
Examination Report for European Patent Application No. 21790723.7, mailed Mar. 7, 2024, 5 pages.
Notice of Allowance for U.S. Appl. No. 17/343,912, mailed Mar. 4, 2024, 7 pages.
Non-Final Office Action for U.S. Appl. No. 17/331,996, mailed Feb. 1, 2024, 9 pages.
Notice of Allowance for U.S. Appl. No. 17/331,996, mailed Mar. 1, 2024, 8 pages.
Ma, Hongyan, "Application and implementation of envelope tracking technology in mobile terminal RF power amplifier," Computers and Telecommunications, Oct. 2017, 18 pages.
First Office Action for Chinese Patent Application No. 201910092452.X, mailed Jul. 31, 2024, 17 pages.
First Office Action for Chinese Patent Application No. 201910512645.6, mailed Jul. 3, 2024, 15 pages.
First Office Action for Chinese Patent Application No. 201911232472.9, mailed Jul. 23, 2024, 10 pages.
First Office Action for Chinese Patent Application No. 201911312703.7, mailed Jul. 16, 2024, 10 pages.
Non-Final Office Action for U.S. Appl. No. 18/254,155, mailed Sep. 4, 2024, 14 pages.
Corrected Notice of Allowability for U.S. Appl. No. 17/331,996, mailed Aug. 1, 2024, 6 pages.
Non-Final Office Action for U.S. Appl. No. 17/579,796, mailed Aug. 30, 2024, 6 pages.
Notice of Allowance for U.S. Appl. No. 17/363,568, mailed Sep. 19, 2024, 6 pages.

\* cited by examiner

POWER MANAGEMENT APPARATUS OPERABLE WITH MULTIPLE CONFIGURATIONS

RELATED APPLICATIONS

This application is a 35 USC 371 national phase filing of International Application No. PCT/US2021/054141, filed Oct. 8, 2021, which claims the benefit of provisional patent application Ser. No. 63/128,882, filed Dec. 22, 2020, the disclosures of which are incorporated herein by reference in their entireties.

FIELD OF THE DISCLOSURE

The technology of the disclosure relates generally to a power management apparatus.

BACKGROUND

Fifth generation (5G) new radio (NR) (5G-NR) has been widely regarded as the next generation of wireless communication technology beyond the current third generation (3G) and fourth generation (4G) technologies. In this regard, a wireless communication device capable of supporting the 5G-NR wireless communication technology is expected to achieve higher data rates, improved coverage range, enhanced signaling efficiency, and reduced latency across a wide range of licensed radio frequency (RF) spectrum, which can include low-band spectrum (below 1 GHz), mid-band spectrum (1 GHz to 6 GHz), and high-band spectrum (above s24 GHz).

In addition, the wireless communication device is also required to support local area networking technologies, such as Wi-Fi, in unlicensed 2.4 GHz and 5 GHz spectrums. Further, it may be necessary for the wireless communication device to support both licensed and unlicensed spectrums concurrently to enable communications based on, for example, licensed-assisted access (LAA) scheme. As such, it is desirable to ensure the wireless communication device can operate with flexible multi-band radio frequency (RF) front-end configurations to help reduce complexity and footprint.

SUMMARY

Embodiments of the disclosure relate to a power management apparatus operatable with multiple configurations. In embodiments disclosed herein, the power management apparatus can be configured to concurrently generate multiple modulated voltages based on a configuration including a single power management integrated circuit (PMIC) or a configuration including a PMIC and a distributed PMIC. Regardless of the configuration, the power management apparatus employs a single switcher circuit, wherein multiple reference voltage circuits are configured to share a multi-level charge pump (MCP). As a result, it is possible to reduce footprint of the power management apparatus while improving isolation between the multiple modulated voltages.

In one aspect, a power management apparatus is provided. The power management apparatus includes a first voltage circuit configured to generate a first modulated voltage based on a first target voltage and a first reference voltage. The power management apparatus also includes a second voltage circuit configured to generate a second modulated voltage based on a second target voltage and a second reference voltage. The power management apparatus also includes a switcher circuit. The switcher circuit includes an MCP configured to generate a low-frequency voltage as a function of a battery voltage. The switcher circuit also includes a first reference voltage circuit coupled between the MCP and the first voltage circuit and configured to generate the first reference voltage based on the low-frequency voltage. The switcher circuit also includes a second reference voltage circuit coupled between the MCP and the second reference voltage circuit and configured to generate the second reference voltage based on the low-frequency voltage. The power management apparatus also includes a control circuit. The control circuit is configured to cause the MCP to generate the low-frequency voltage based on a selected one of the first target voltage and the second target voltage.

In another aspect, a PMIC is provided. The PMIC includes a switcher circuit. The switcher circuit includes an MCP configured to generate a low-frequency voltage as a function of a battery voltage. The switcher circuit also includes a first reference voltage circuit coupled between the MCP and a first voltage circuit configured to generate a first modulated voltage based on a first target voltage and a first reference voltage, the first reference voltage circuit configured to generate the first reference voltage based on the low-frequency voltage. The switcher circuit also includes a second reference voltage circuit coupled between the MCP and a second voltage circuit configured to generate a second modulated voltage based on a second target voltage and a second reference voltage, the second reference voltage circuit configured to generate the second reference voltage based on the low-frequency voltage. The PMIC also includes a control circuit. The control circuit is configured to cause the MCP to generate the low-frequency voltage based on a selected one of the first target voltage and the second target voltage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2:
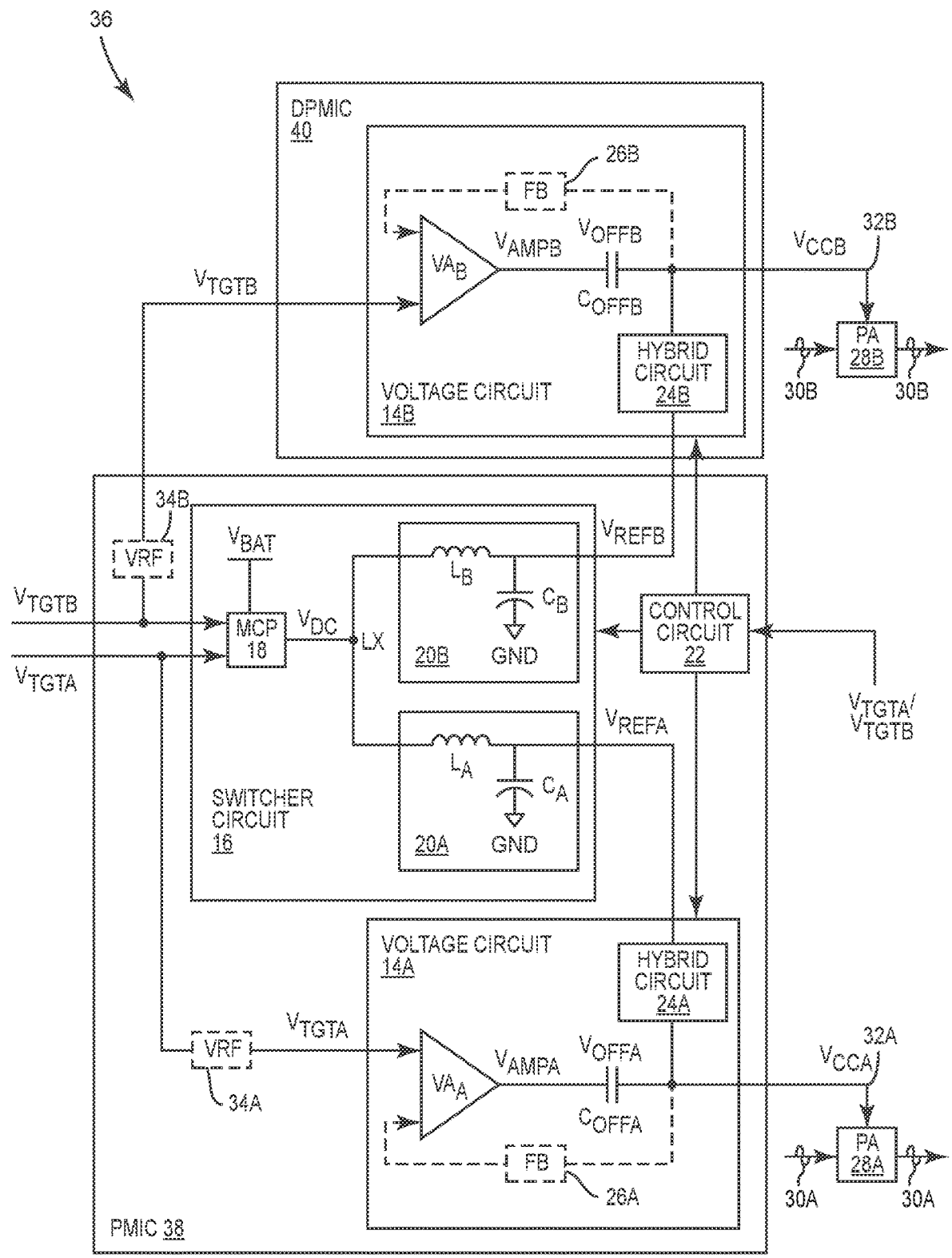

FIG. 1 is a schematic diagram of an exemplary power management apparatus configured according to an embodiment of the present disclosure to include a power management integrated circuit (PMIC); and FIG. 2 is a schematic diagram of an exemplary power management apparatus configured according to another embodiment of the present disclosure to include a PMIC and a distributed PMIC separated from the PMIC.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a power management apparatus operable with multiple configurations. In embodiments disclosed herein, the power management apparatus can be configured to concurrently generate multiple modulated voltages based on a configuration including a single power management integrated circuit (PMIC) or a configuration including a PMIC and a distributed PMIC. Regardless of the configuration, the power management apparatus employs a single switcher circuit, wherein multiple reference voltage circuits are configured to share a multi-level charge pump (MCP). As a result, it is possible to reduce footprint of the power management apparatus while improving isolation between the multiple modulated voltages.

In this regard, FIG. 1 is a schematic diagram of an exemplary power management apparatus 10 configured according to an embodiment of the present disclosure to include a PMIC 12. The PMIC 12 is configured to include a first voltage circuit 14A and a second voltage circuit 14B. The first voltage circuit 14A is configured to generate a first modulated voltage $V_{CCA}$ based on a first target voltage $V_{TGTA}$ and a first reference voltage $V_{REFA}$. The second voltage circuit 14B is configured to generate a second modulated voltage $V_{CCB}$ based on a second target voltage $V_{TGTB}$ and a second reference voltage $V_{REFB}$. Notably, the first modulated voltage $V_{CCA}$ and the second modulated voltage $V_{CCB}$ can be envelope tracking (ET) voltages or average power tracking (APT) voltages.

The PMIC 12 also includes a switcher circuit 16, which is shared by the first voltage circuit 14A and the second voltage circuit 14B. The switcher circuit 16 includes a multi-level charge pump (MCP) 18. The MCP 18 is configured to generate a low-frequency voltage $V_{DC}$ (e.g., a direct-current (DC) voltage) at a coupling node LX, as a function of a battery voltage $V_{BAT}$. In a non-limiting example, the MCP 18 can be a buck-boost DC-DC converter that can operate in a buck mode to generate the low-frequency voltage $V_{DC}$ at 0 volt (V) or at $V_{BAT}$ or operate in a boost mode to generate the low-frequency voltage $V_{DC}$ at $2V_{BAT}$.

The switcher circuit 16 also includes a first reference voltage circuit 20A and a second reference voltage circuit 20B. In contrast to a conventional configuration wherein an MCP only supports a single reference voltage circuit, the first reference voltage circuit 20A and the second reference voltage circuit are both coupled to the coupling node LX to share the MCP 18. By sharing the MCP 18 between the first reference voltage circuit 20A and the second reference voltage circuit 20B, it is possible to reduce footprint of the power management apparatus 10 while improving isolation between the first modulated voltage $V_{CCA}$ and the second modulated voltage $V_{CCB}$.

Specifically, the first reference voltage circuit 20A is coupled between the coupling node LX and the first voltage circuit 14A, and the second reference voltage circuit 20B is coupled between the coupling node LX and the second voltage circuit 14B. The first voltage circuit 14A and the second voltage circuit 14B are each configured to generate a respective one of the first reference voltage $V_{REFA}$ and the second reference voltage $V_{REFB}$ based on the low-frequency voltage $V_{DC}$.

The PMIC 12 can further include a control circuit 22, which can be a field-programmable gate array (FPGA) or an application-specific integrated circuit (ASIC), as an example. As discussed in detail below, the control circuit 22 is configured to determine an appropriate duty cycle based on a selected one of the first target voltage $V_{TGTA}$ and the second target voltage $V_{TGTB}$ to thereby cause the MCP 18 to generate the low-frequency voltage $V_{DC}$ at a desirable level.

Each of the first reference voltage circuit 20A and the second reference voltage circuit 20B may be an inductor-capacitor (LC) circuit. Specifically, the first reference voltage circuit 20A includes a first inductor $L_A$ and a first capacitor $C_A$ and the second reference voltage circuit 20B includes a second inductor $L_B$ and a second capacitor $C_B$. In this regard, the first reference voltage circuit 20A and the second reference voltage circuit 20B can each resonate at a respective resonance frequency to generate a respective one of the first reference voltage $V_{REFA}$ and the second reference voltage $V_{REFB}$ as an average of the low-frequency voltage $V_{DC}$. For example, if the battery voltage $V_{BAT}$ is 5 V and the MCP 18 is configured to toggle between 0 V, $V_{BAT}$ (5 V), and $2V_{BAT}$ (10 V) based on a 30-30-40 duty cycle, then the average of the low-frequency voltage $V_{DC}$ will equal 5.5 V (0 V*30%+5 V*30%+10 V*40%).

In a non-limiting example, the first inductor $L_A$ and the second inductor $L_B$ can be configured to have identical inductance, and the first capacitor $C_A$ and the second capacitor $C_B$ can be configured to have identical capacitance. As a result, the first reference voltage circuit 20A and the second reference voltage circuit 20B will resonate at an identical resonance frequency to thereby cause the first reference voltage $V_{REFA}$ to be substantially equal to the second reference voltage $V_{REFB}$ (e.g., $V_{REFA}=V_{REFB}\pm 0.1$ V). It should be appreciated that it is also possible to configure the first reference voltage circuit 20A and the second reference voltage circuit 20B to resonate at different resonance frequencies to thereby cause the first reference voltage $V_{REFA}$ to be different from the second reference voltage $V_{REFB}$.

The first voltage circuit 14A can be configured to include a first voltage amplifier $VA_A$, a first offset capacitor $C_{OFFA}$, and a first hybrid circuit 24A. The first voltage amplifier $VA_A$ is configured to generate a first initial modulated voltage $V_{AMPA}$ based on the first target voltage $V_{TGTA}$. The first offset capacitor $C_{OFFA}$ is configured to raise the first initial modulated voltage $V_{AMPA}$ by a first offset voltage $V_{OFFA}$ to generate the first modulated voltage $V_{CCA}$ ($V_{CCA}=V_{AMPA}+V_{OFFA}$). The first hybrid circuit 24A is configured to modulate the first offset voltage $V_{OFFA}$ based on the first reference voltage $V_{REFA}$. The first voltage circuit 14A may also include a first feedback circuit 26A (denoted as "FB") to thereby make the first voltage circuit 14A a closed-loop voltage circuit.

Similarly, the second voltage circuit 14B can be configured to include a second voltage amplifier $VA_B$, a second offset capacitor $C_{OFFB}$, and a second hybrid circuit 24B. The second voltage amplifier $VA_B$ is configured to generate a second initial modulated voltage $V_{AMPB}$ based on the second target voltage $V_{TGTB}$. The second offset capacitor $C_{OFFB}$ is configured to raise the second initial modulated voltage $V_{AMPB}$ by a second offset voltage $V_{OFFB}$ to generate the second modulated voltage $V_{CCB}$ ($V_{CCB}=V_{AMPB}+V_{OFFB}$). The second hybrid circuit 24B is configured to modulate the second offset voltage $V_{OFFB}$ based on the second reference voltage $V_{REFB}$. The second voltage circuit 14B may also include a second feedback circuit 26B (denoted as "FB") to thereby make the second voltage circuit 14B a closed-loop voltage circuit.

In an embodiment, the first hybrid circuit 24A and the second hybrid circuit 24B can each be configured to operate in a switch mode or a low dropout (LDO) mode. When operating in the switch mode, each of the first hybrid circuit 24A and the second hybrid circuit 24B can cause a respective one of the first offset voltage $V_{OFFA}$ and the second offset voltage $V_{OFFB}$ to be equal to a respective one of the first reference voltage $V_{REFA}$ and the second reference voltage $V_{REFB}$. In contrast, when operating in the LDO mode, each of the first hybrid circuit 24A and the second hybrid circuit 24B can cause a respective one of the first offset voltage $V_{OFFA}$ and the second offset voltage $V_{OFFB}$ to be lower than a respective one of the first reference voltage $V_{REFA}$ and the second reference voltage $V_{REFB}$.

As mentioned earlier, the control circuit 22 may determine an appropriate duty cycle based on a selected one of the first target voltage $V_{TGTA}$ and the second target voltage $V_{TGTB}$ to thereby cause the MCP 18 to generate the low-frequency voltage $V_{DC}$ at a desirable level. In an embodiment, the control circuit 22 can determine the selected one of the first target voltage $V_{TGTA}$ and the second target voltage $V_{TGTB}$ as any one of the first target voltage $V_{TGTA}$ and the second target voltage $V_{TGTB}$ having a higher root-mean-square (RMS) level.

In one non-limiting example, the control circuit 22 determines that the first target voltage $V_{TGTA}$ has the higher RMS level than the second target voltage $V_{TGTB}$. As such, the control circuit 22 can determine the duty cycle based on the first target voltage $V_{TGTA}$ to thereby cause the MCP 18 to generate the low-frequency voltage $V_{DC}$ based on the first target voltage $V_{TGTA}$. Accordingly, the control circuit 22 can cause the first hybrid circuit 24A to operate in the switch mode and cause the second hybrid circuit 24B to operate in the LDO mode.

In another non-limiting example, the control circuit 22 determines that the second target voltage $V_{TGTB}$ has the higher RMS level than the first target voltage $V_{TGTA}$. As such, the control circuit 22 can determine the duty cycle based on the second target voltage $V_{TGTB}$ to thereby cause the MCP 18 to generate the low-frequency voltage $V_{DC}$ based on the second target voltage $V_{TGTB}$. Accordingly, the control circuit 22 can cause the second hybrid circuit 24B to operate in the switch mode and cause the first hybrid circuit 24A to operate in the LDO mode.

In another non-limiting example, the control circuit 22 determines that the second target voltage $V_{TGTB}$ has an equal RMS level as the first target voltage $V_{TGTA}$. As such, the control circuit 22 can determine the duty cycle based on any of the first target voltage $V_{TGTA}$ and the second target voltage $V_{TGTB}$ to thereby cause the MCP 18 to generate the low-frequency voltage $V_{DC}$ based on either the first target voltage $V_{TGTA}$ or the second target voltage $V_{TGTB}$. Accordingly, the control circuit 22 can cause the second hybrid circuit 24B and the first hybrid circuit 24A to both operate in the switch mode.

The first voltage circuit 14A may provide the first modulated voltage $V_{CCA}$ to a first power amplifier circuit 28A (denoted as "PA") for amplifying a first radio frequency (RF) signal 30A. The second voltage circuit 14B may provide the second modulated voltage $V_{CCB}$ to a second power amplifier circuit 28B (denoted as "PA") for amplifying a second RF signal 30B. In a non-limiting example, the first RF signal 30A may be amplified for transmission in a licensed band and the second RF signal 30B may be amplified for transmission in an unlicensed band. In this regard, the power management apparatus 10 can be configured to enable communications based on, for example, a licensed-assisted access (LAA) scheme. In another non-limiting example, the first RF signal 30A and the second RF signal 30B may be amplified for simultaneous transmission in a licensed band(s) to enable communications based on, for example, a dual-connectivity (DC) scheme. In another non-limiting example, the first RF signal 30A and the second RF signal 30B may be amplified for simultaneous transmission in an unlicensed band(s) to enable communications based on, for example, a Wi-Fi multiple-input multiple-output (MIMO) scheme.

In an embodiment, the first voltage circuit 14A and the second voltage circuit 14B are each coupled to a respective one of the first power amplifier circuit 28A and the second power amplifier circuit 28B via a respective one of a first conductive line 32A and a second conductive line 32B. Notably, the first conductive line 32A and the second conductive line 32B can each introduce respective trace inductance that can distort a respective one of the first modulated voltage $V_{CCA}$ and the second modulated voltage $V_{CCB}$ to potentially cause amplitude clipping at a respective one of the first power amplifier circuit 28A and the second power amplifier circuit 28B.

In this regard, the PMIC 12 may be configured to include a first voltage equalizer 34A and a second voltage equalizer 34B (both denoted as "VRF"). The first voltage equalizer 34A and/or the second voltage equalizer 34B can be configured to equalize the first target voltage $V_{TGTA}$ and/or the second target voltage $V_{TGTB}$ to help offset the trace inductance caused by the first conductive line 32A and/or the second conductive line 32B. Notably, the trace inductance caused by the first conductive line 32A and/or the second conductive line 32B can correspond to a transfer function having a second-order complex pole term. In this regard, to offset the trace inductance caused by the first conductive line 32A and/or the second conductive line 32B, the first voltage equalizer 34A and/or the second voltage equalizer 34B can be configured to equalize the first target voltage $V_{TGTA}$ and/or the second target voltage $V_{TGTB}$ based on a transfer function with a second-order complex-zero term. For an example of the first voltage equalizer 34A and the second voltage equalizer 34B, please refer to U.S. patent application Ser. No. 17/412,823, entitled "EQUALIZER CIRCUIT AND RELATED POWER MANAGEMENT CIRCUIT."

Alternative to configuring the power management apparatus 10 to provide the first modulated voltage $V_{CCA}$ and the second modulated voltage $V_{CCB}$ based exclusively on the PMIC 12, it is also possible to provide the first modulated voltage $V_{CCA}$ and the second modulated voltage $V_{CCB}$ based on more than the PMIC 12. In this regard, FIG. 2 is a schematic diagram of an exemplary power management apparatus 36 configured according to another embodiment of the present disclosure to include a PMIC 38 and a distributed PMIC (DPMIC) 40 separated from the PMIC 38. Common elements between FIGS. 1 and 2 are shown therein with common element numbers and will not be re-described herein.

In contrast to the PMIC 12 in FIG. 1, the second voltage circuit 14B is instead provided in the DPMIC 40 that is physically separated from the PMIC 38 (e.g., in different dies). Such configuration can provide an increased flexibility as to where the first power amplifier circuit 28A and the second power amplifier circuit 28B can be provided in a wireless communication device (e.g., smart phone). For example, the first power amplifier circuit 28A can be disposed close to an antenna(s) mounted on a top side of the wireless communication device, while the second power amplifier circuit 28B can be so disposed close to an antenna(s) mounted on a bottom side of the wireless communication device.

Those skilled in the art will recognize improvements and modifications to the preferred embodiments of the present disclosure. All such improvements and modifications are considered within the scope of the concepts disclosed herein and the claims that follow.

What is claimed is:

1. A power management apparatus comprising:
   a switcher circuit comprising:
      a multi-level charge pump (MCP) configured to operate based on a duty cycle to generate a low-frequency voltage as a function of a battery voltage;
      a first reference voltage circuit configured to generate a first reference voltage based on the low-frequency voltage; and
      a second reference voltage circuit configured to generate a second reference voltage based on the low-frequency voltage;
   a control circuit configured to determine the duty cycle based on a selected one of a first target voltage and a second target voltage;
   a first voltage circuit coupled to the first reference voltage circuit and configured to generate a first modulated voltage comprising a first initial modulated voltage generated based on the first target voltage and a first offset voltage modulated based on the first reference voltage; and
   a second voltage circuit coupled to the second reference voltage circuit and configured to generate a second modulated voltage comprising a second initial modulated voltage generated based on the second target voltage and a second offset voltage modulated based on the second reference voltage.

2. The power management apparatus of claim 1, wherein the first reference voltage circuit and the second reference voltage circuit are each configured to generate a respective one of the first reference voltage and the second reference voltage as an average of the low-frequency voltage.

3. The power management apparatus of claim 2, wherein each of the first reference voltage circuit and the second reference voltage circuit is an inductor-capacitor (LC) circuit configured to resonate at a respective resonance frequency to generate the respective one of the first reference voltage and the second reference voltage as the average of the low-frequency voltage.

4. The power management apparatus of claim 2, wherein the first reference voltage is substantially equal to the second reference voltage.

5. The power management apparatus of claim 1, wherein:
   the first voltage circuit comprises:
      a first voltage amplifier configured to generate the first initial modulated voltage based on the first target voltage;
      a first offset capacitor configured to raise the first initial modulated voltage by the first offset voltage to generate the first modulated voltage; and
      a first hybrid circuit configured to modulate the first offset voltage based on the first reference voltage; and
   the second reference voltage circuit comprises:
      a second voltage amplifier configured to generate the second initial modulated voltage based on the second target voltage;
      a second offset capacitor configured to raise the second initial modulated voltage by the second offset voltage to generate the second modulated voltage; and
      a second hybrid circuit configured to modulate the second offset voltage based on the second reference voltage.

6. The power management apparatus of claim 5, wherein the first hybrid circuit and the second hybrid circuit are each configured to:
- operate in a switch mode to cause a respective one of the first offset voltage and the second offset voltage to be equal to a respective one of the first reference voltage and the second reference voltage; and
- operate in a low dropout (LDO) mode to cause the respective one of the first offset voltage and the second offset voltage to be lower than the respective one of the first reference voltage and the second reference voltage.

7. The power management apparatus of claim 6, wherein the control circuit is further configured to determine the selected one of the first target voltage and the second target voltage as any one of the first target voltage and the second target voltage having a higher root-mean-square (RMS) level.

8. The power management apparatus of claim 7, wherein the control circuit is further configured to:
- determine that the first target voltage has the higher RMS level than the second target voltage;
- cause the MCP to generate the low-frequency voltage based on the first target voltage;
- cause the first hybrid circuit to operate in the switch mode; and
- cause the second hybrid circuit to operate in the LDO mode.

9. The power management apparatus of claim 7, wherein the control circuit is further configured to:
- determine that the second target voltage has the higher RMS level than the first target voltage;
- cause the MCP to generate the low-frequency voltage based on the second target voltage;
- cause the first hybrid circuit to operate in the LDO mode; and
- cause the second hybrid circuit to operate in the switch mode.

10. The power management apparatus of claim 7, wherein the control circuit is further configured to:
- determine that the first target voltage and the second target voltage have an equal RMS level;
- cause the MCP to generate the low-frequency voltage based on any of the first target voltage and the second target voltage;
- cause the first hybrid circuit to operate in the switch mode; and
- cause the second hybrid circuit to operate in the switch mode.

11. The power management apparatus of claim 1, further comprising a power management integrated circuit (PMIC).

12. The power management apparatus of claim 11, wherein the PMIC comprises the first voltage circuit, the second reference voltage circuit, the switcher circuit, and the control circuit.

13. The power management apparatus of claim 11, wherein the PMIC comprises the first voltage circuit, the switcher circuit, and the control circuit.

14. The power management apparatus of claim 13, further comprising a distributed PMIC separated from the PMIC and comprising the second reference voltage circuit.

15. A wireless device comprising a power management apparatus, the power management apparatus comprises:
- a switcher circuit comprising:
  - a multi-level charge pump (MCP) configured to operate based on a duty cycle to generate a low-frequency voltage as a function of a battery voltage;
  - a first reference voltage circuit configured to generate a first reference voltage based on the low-frequency voltage; and
  - a second reference voltage circuit configured to generate a second reference voltage based on the low-frequency voltage;
- a control circuit configured to determine the duty cycle based on a selected one of a first target voltage and a second target voltage;
- a first voltage circuit coupled to the first reference voltage circuit and configured to generate a first modulated voltage comprising a first initial modulated voltage generated based on the first target voltage and a first offset voltage modulated based on the first reference voltage; and
- a second voltage circuit coupled to the second reference voltage circuit and configured to generate a second modulated voltage comprising a second initial modulated voltage generated based on the second target voltage and a second offset voltage modulated based on the second reference voltage.

* * * * *